(12) United States Patent
Teraguchi (10) Patent No.: US 10,109,581 B2
(45) Date of Patent: Oct. 23, 2018

(54) SEMICONDUCTOR DEVICE

(71) Applicant: KABUSHIKI KAISHA TOSHIBA, Tokyo (JP)

(72) Inventor: Takayuki Teraguchi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/442,688

(22) Filed: Feb. 26, 2017

(65) Prior Publication Data

US 2018/0076125 A1    Mar. 15, 2018

(30) Foreign Application Priority Data

Sep. 13, 2016 (JP) ................. 2016-178970

(51) Int. Cl.
| | |
|---|---|
| *H01L 23/528* | (2006.01) |
| *H01L 23/00* | (2006.01) |
| *H01L 23/532* | (2006.01) |
| *H01L 27/12* | (2006.01) |
| *H04B 1/40* | (2015.01) |

(52) U.S. Cl.
CPC ........ *H01L 23/528* (2013.01); *H01L 23/5329* (2013.01); *H01L 24/13* (2013.01); *H01L 27/1203* (2013.01); *H04B 1/40* (2013.01)

(58) Field of Classification Search
None
See application file for complete search history.

(56) References Cited

U.S. PATENT DOCUMENTS

| | | | |
|---|---|---|---|
| 7,944,059 B2 | 5/2011 | Nagai et al. | |
| 8,283,791 B2 | 10/2012 | Toba et al. | |
| 8,878,203 B2 | 11/2014 | Teraguchi | |
| 2005/0068116 A1* | 3/2005 | Ham ................ | H01P 3/026 331/107 SL |
| 2012/0096419 A1* | 4/2012 | Mina ................ | G06F 17/5068 716/106 |
| 2015/0255015 A1 | 9/2015 | Takahara | |
| 2015/0263721 A1 | 9/2015 | Ishimaru et al. | |

FOREIGN PATENT DOCUMENTS

JP          4743469 B2     8/2011

* cited by examiner

*Primary Examiner* — Erik Kielin
(74) *Attorney, Agent, or Firm* — Patterson & Sheridan, LLP (57) ABSTRACT

A semiconductor device includes a field effect transistor formed on a semiconductor layer. The field effect transistor can be used for passing or blocking a radio frequency signal. A signal interconnection wiring is above the field effect transistor in a first direction. A plurality of conductors, which are in electrically insulated from each other and other elements in the device, is between the field effect transistor and the signal interconnection wiring in the first direction. A length, in a second direction, of each floating conductor is less than a width, in the second direction, of a gate of the field effect transistor. Here, the second direction is parallel to the plane of the semiconductor layer and perpendicular to a gate length direction of the field effect transistor.

20 Claims, 6 Drawing Sheets

SEMICONDUCTOR DEVICE

CROSS-REFERENCE TO RELATED APPLICATION

This application is based upon and claims the benefit of priority from Japanese Patent Application No. 2016-178970, filed Sep. 13, 2016, the entire contents of which are incorporated herein by reference.

FIELD

Embodiments described herein relate generally to a semiconductor device.

BACKGROUND

In recent years, mobile communication devices such as mobile terminals have increasingly supported multi-band technology. Many such mobile communication devices can transmit and receive a plurality of radio frequency signals simultaneously by means of carrier aggregation (CA), MIMO (Multiple-Input and Multiple-Output), or the like. A radio frequency switch circuit for use in these mobile communication devices must be complex to enable simultaneous switching of multiple radio frequency signals. However, it is also generally desirable for these switch circuits to be as small as possible to permit miniaturization of these mobile devices. However, miniaturization of these radio frequency switch circuits disadvantageously increases the capacitive coupling between internal elements, interconnections, and the like, thus disadvantageously resulting in worse leakage and degradation of radio frequency signals transmitted and received through these devices.

DETAILED DESCRIPTION

In general, according to one embodiment, a semiconductor device includes a field effect transistor formed on a semiconductor layer. The field effect transistor can be used for passing or blocking a radio frequency signal. A signal interconnection wiring is above the field effect transistor in a first direction that is orthogonal to a plane of the semiconductor layer. A plurality of floating conductors is between the field effect transistor and the signal interconnection wiring in the first direction. A length, in a second direction, of each floating conductor in the plurality of floating conductors is less than a width, in the second direction, of a gate of the field effect transistor, and the second direction is parallel to the plane of the semiconductor layer and perpendicular to a gate length (channel length) direction of the field effect transistor.

Example embodiments according to the present disclosure will be described hereinafter with reference to the drawings. The example embodiments are not intended to limit the present disclosure.

(First Embodiment)

Figure 1:
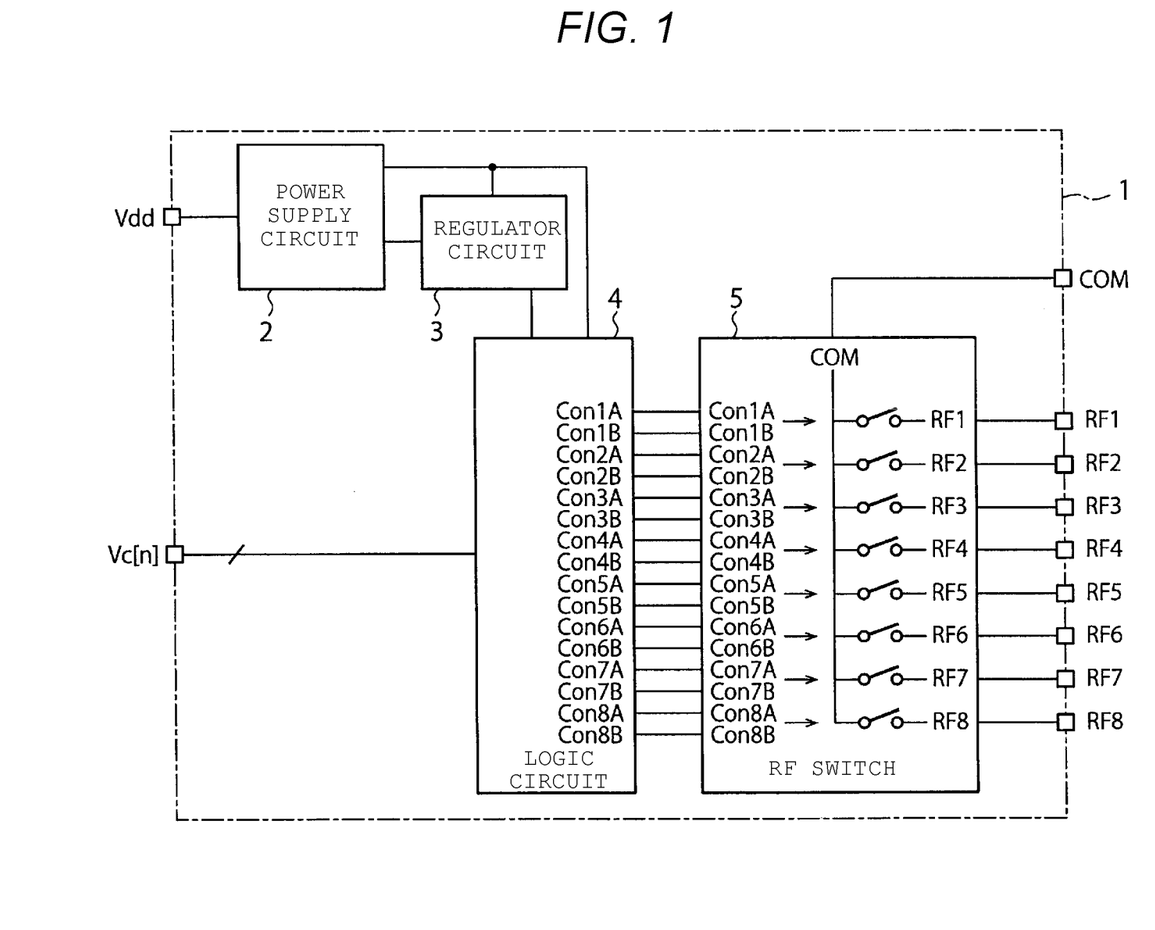
FIG. 1 illustrates an example of a configuration of a radio frequency transmission and reception circuit according to a first embodiment.

FIG. 1 illustrates an example of a configuration of a radio frequency transmission and reception (transceiver) circuit 1 according to a first embodiment. The radio frequency transmission and reception circuit 1, which can be used in an electronic device for transmitting and receiving radio frequency signals, can be applied to, for example, a mobile communication terminal such as a mobile phone, a smartphone, a wireless tablet, a wireless router, a wireless base station, or a wireless access point. The radio frequency transmission and reception circuit 1 may be configured as one semiconductor chip (an integrated circuit) or may be configured as a module comprising a plurality of semiconductor chips.

The radio frequency transmission and reception circuit 1 includes a power supply circuit 2, a regulator circuit 3, a logic circuit 4, and an RF switch circuit 5. The power supply circuit 2 receives external power Vdd and supplies power to the regulator circuit 3 and the logic circuit 4. The regulator circuit 3 controls the voltage supplied from the power supply circuit 2 to be a predetermined voltage and supplies this predetermined voltage to the logic circuit 4. The logic circuit 4 transmits the control signals Con1A to Con8A and Con1B to Con8B to the RF switch circuit 5 to control the switching of the RF switch circuit 5 on the basis of control signals Vc [n]. The RF switch circuit 5 selects a radio frequency signal received from any of ports RF1 to RF8 to be connected to a common port COM in accordance with the control signals Con1A to Con8A and Con1B to Con8B. Alternatively, the RF switch circuit 5 outputs a radio frequency signal received from the common port COM to any of the ports RF1 to RF8 in accordance with the control signals Con1A to Con8A and Con1B to Con8B. That is, the RF switch circuit 5 is a so-called SPnT (single-port-n-throw) switch. The RF switch circuit 5 is not limited to the SPnT switch and may be a switch having another configuration. The ports RF1 to RF8 are connected to an antenna (not shown) and each can transmit and receive a radio frequency signal.

Figure 2:
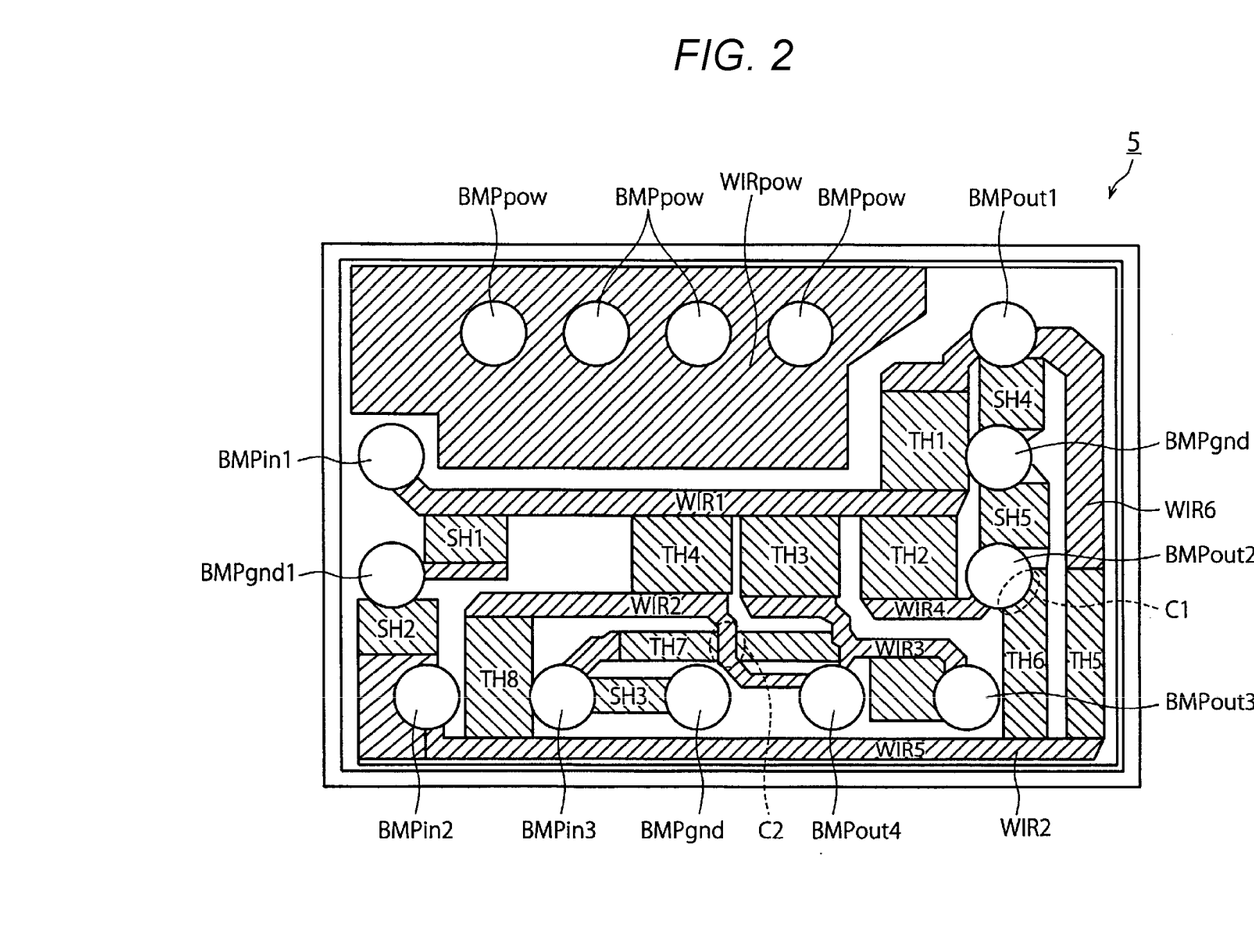
FIG. 2 is a layout diagram illustrating an example configuration of an RF switch circuit according to the first embodiment.

FIG. 2 is a layout diagram illustrating an example of a configuration of the RF switch circuit 5 according to the first embodiment. In the first embodiment, the RF switch circuit 5 is, for example, provided on an SOI (silicon on insulator) substrate and configured as one semiconductor chip.

The RF switch circuit 5 includes through-switches (through FET (field effect transistors)) TH1 to TH8, shunt switches (shunt FETs) SH1 to SH5, power supply interconnects WIRpow and WIR1 to WIRE, input bumps (terminals) BMPin1 to BMPin3, output bumps (terminals) BMPout1 to BMPout4, ground bumps (terminals) BMPgnd, and power supply bumps (terminals) BMPpow.

The through-switches TH1 to TH8 each include a plurality of FETs connected in series between one of the input bumps BMPin1 to BMPin3 and one of the output bumps BMPout1 to BMPout4. The through-switches TH1 to TH8 can thereby pass or block radio frequency signals between input bumps BMPin1 to BMPin3 and output bumps BMPout1 to BMPout4.

For example, the through-switch TH1 includes a plurality of FETs connected between the input bump BMPin1 and the output bump BMPout1. The through-switch TH1 thereby passes (transmits) or blocks a radio frequency signal between the input bump BMPin1 and the output bump BMPout1. Similarly, the through-switches TH2 to TH4 each include a plurality of FETs connected between the input bump BMPin1 and a respective one of the output bumps BMPout2 to BMPout4. The through-switches TH2 to TH4 thereby transmit or block radio frequency signals between the input bump BMPin1 and any of the output bumps BMPout2 to BMPout4. Furthermore, the through-switches TH5 to TH8 respectively transmit or block radio frequency signals between the input bump BMPin2 and the output bump BMPout1, the input bump BMPin2 and the output bump BMPout2, the input bump BMPin3 and the output bump BMPout3, and the input bump BMPin2 and the output bump BMPout4.

The shunt switches SH1 to SH5 each include a plurality of FETs connected in series between one of the input bumps BMPin1 to BMPin3, or one of the output bumps BMPout1 and BMPout2, and one of the ground bumps BMPgnd. The shunt switches SH1 to SH5 can thereby short-circuit (shunt) any of the input bumps BMPin1 to BMPin3 or of the output bumps BMPout1 and BMPout2 to one of the ground bumps BMPgnd.

For example, the shunt switch SH1 includes a plurality of FETs connected in series between the input bump BMPin1 and one of the ground bmp BMPgnd. The shunt switch SH1 can thereby shunt (connect) the input bump BMPin1 to the ground bump BMPgnd. Similarly, the shunt switches SH2 to SH5 respectively include a plurality of FETs connected between the input bump BMPin2 and a ground bmp BMPgnd, the input bump BMPin3 and a ground bmp BMPgnd, the output bump BMPout1 and a ground bmp BMPgnd, and the output bump BMPout2 and a ground bmp BMPgnd. The shunt switches SH2 to SH5 can thereby shunt the input bump BMPin2, the input bump BMPin3, the output bump BMPout1, and the output bump BMPout2 to a ground bump BMPgnd, respectively.

The signal interconnection (wiring) WIR1 connects the input bump BMPin1 to the switches TH1 to TH4 and SH1. The signal interconnection (wiring) WIR2 connects the output bump BMPout4 to the through-switch TH8. The signal interconnection (wiring) WIR3 connects the output bumps BMPout3 and BMPout4 to the switches TH3 and TH7. The signal interconnection (wiring) WIR4 connects the output bump BMPout2 to the switch TH2. The signal interconnection (wiring) WIR5 connects the input bump BMPin2 to the switches TH5 and TH6. The signal interconnection (wiring) WIRE connects the output bump BMPout1 to the switch TH5. It is noted that the RF switch circuit 5 may generally include other signal interconnection wirings, connectors, and the like, which are not specifically described herein.

At least one of the input bumps BMPin1 to BMPin3 and at least one of the output bumps BMPout1 to BMPout4 would be connected to the port COM in FIG. 1, whereas the other bumps would be connected to the ports RF1 to RF8. While the number of bumps depicted in FIG. 2 does not match the number of ports depicted in FIG. 1, FIGS. 1 and 2 are exemplarily and the number bumps or ports depicted is for the sake of explanatory convenience and the radio frequency transmission and reception circuit 1 and the RF switch circuit 5 can be designed arbitrarily such that the number of bumps can be provided to match the desired number of ports.

In the layout shown in FIG. 2, the input bumps BMPin1 to BMPin3, the output bumps BMPout1 to BMPout4, or the interconnection layers connecting those bumps to a switch are disposed above the through-switches or the shunt switches. In a dashed circle C1 of FIG. 2, for example, the output bump BMPout2 is provided above a portion of the through-switch TH6. Furthermore, in a dashed circle C2, the signal interconnection WIR2 is provided above the through-switch TH7.

In this way, by overlapping elements, it is possible to reduce the dimensions of the RF switch circuit 5 by disposing the bumps, the interconnections or the like above the through-switches or the shunt switches. However, disposing the bumps, the interconnections or the like above the through-switches or the shunt switches typically causes an increase in capacitive coupling between the bumps or interconnections and the through-switches or shunt switches, disadvantageously resulting in signal leakage and degradation of radio frequency signals.

In the consideration of the abovementioned problem, the RF switch circuit 5 according to the first embodiment is configured such that a plurality of (floating) conductors 50 and 51 are provided between the through-switches TH1 to TH8 or shunt switches SH1 to SH5 and the input bumps BMPin1 to BMPin3 or output bumps BMPout1 to BMPout4, and/or between the through-switches TH1 to TH8 or shunt switches SH1 to SH5 and the signal interconnections WIR1 to WIRE. The conductors 50 and 51 will be described with reference to FIGS. 3 and 4.

Figure 3:
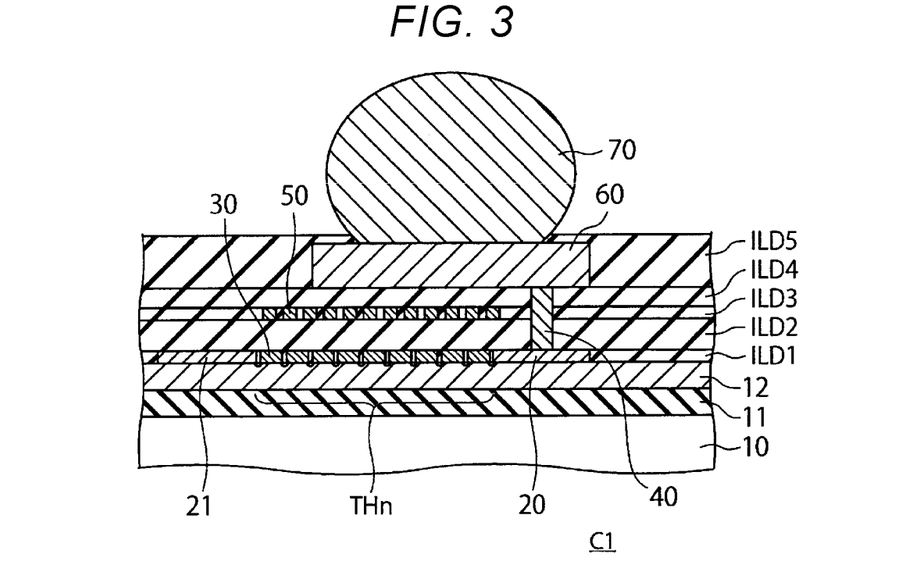
FIG. 3 is a cross-sectional view illustrating a portion of an RF switch circuit according to the first embodiment.

FIG. 3 is a cross-sectional view illustrating a configuration of a portion of the RF switch circuit 5 according to the first embodiment. Here, the RF switch circuit 5 is provided, for example, on an SOI substrate. The SOI substrate includes a substrate 10, an insulating film 11 provided on the substrate 10, and a semiconductor layer 12 provided on the insulating film 11. For example, a semiconductor substrate such as a silicon substrate is used as the substrate 10. For example, an insulating material such as a silicon oxide film is used as the insulating film 11. For example, a semiconductor material such as a silicon layer is used as the semiconductor layer 12.

As depicted, the RF switch circuit 5 includes interconnections (wirings) 20 and 21, a plurality of FETs 30, a contact plug (interlayer interconnection wiring) 40, a plurality of conductors 50, a signal interconnection 60, a bump 70, and interlayer insulating films ILD1 to ILD5.

The FETs 30 are each provided on the semiconductor layer 12 and pass or block radio frequency signals according to a conduction state. The FETs 30 are connected in series between the interconnections 20 and 21 and constitute one through-switch THn (where n is an integer (for example, n=6)).

The interconnection 20 is provided on the semiconductor layer 12 and electrically connects an end of the through-switch THn to the contact plug 40. The interconnection 21 is provided on the semiconductor layer 12 and electrically connects another end of the through-switch THn to other elements (not shown). The through-switch THn and the interconnections 20 and 21 are surrounded (top and sides) with the interlayer insulating films ILD1 and ILD2. For example, a low resistance metal such as aluminum or copper is used for the interconnections 20 and 21.

The contact plug 40 is provided within the interlayer insulating films ILD1 to ILD4 and electrically connects the signal interconnection 60 to the interconnection 20. For example, a low resistance metal such as aluminum or copper is used for the contact plug 40.

The signal interconnection 60 is provided on the interlayer insulating film ILD4 and is provided above at least a part of the FETs 30 included in the through-switch THn. For example, a low resistance metal such as aluminum or copper is used for the signal interconnection 60.

The bump 70 that serves as a terminal is provided on the signal interconnection 60, and is also provided above at least a part of the FETs 30 included in the through-switch THn to which it is connected, similarly to the signal interconnection 60. That is, the signal interconnection 60 and the bump 70 overlap the through-switch THn when being viewed from above along a direction orthogonal to a major surface of the semiconductor layer 12. Here, a major surface refers to a surface of the semiconductor layer 12 that is substantially parallel the layer plane of semiconductor layer 12. For example, the major surface could be either one of the upper or lower surface (or interface) of the semiconductor layer 12 depicted in the FIG. 3. For example, a low resistance metal such as aluminum or copper is used as the bump 70.

The plurality of conductors 50 are provided in a position between the FETs 30 and the signal interconnection 60 and/or bump 70, and are arranged on a plane surface generally parallel to the major surface of the semiconductor layer 12. For example, a low resistance metal such as aluminum or copper is used for the conductors 50, similarly to the signal interconnection 60, the bump 70, and the like. The conductors 50 are each in an electrically floating state and electrically insulated from other elements. Furthermore, the adjacent conductors 50 are electrically insulated from each other. A planar arrangement and a configuration of each of the conductors 50 will be described later in more detail.

The interlayer insulating films ILD1 to ILD5 cover the constituent elements present on device layers lower than the bump 70. For example, an insulating material such as polyimide is used for the interlayer insulating films ILD1 to ILD5.

With the configuration shown in FIG. 3, the bump 70 and the through-switch THn are electrically connected to each other. Therefore, the through-switch THn passes or blocks (switches) radio frequency signals from the bump 70 or radio frequency signals to the bump 70. That is, the radio frequency signals passing through the bump 70 and the signal interconnection 60 are the same as the radio frequency signals passing through the through-switch THn positioned below these elements. For example, a configuration of the dashed region C1 in FIG. 2 is similar to the configuration shown in FIG. 3.

Figure 4:
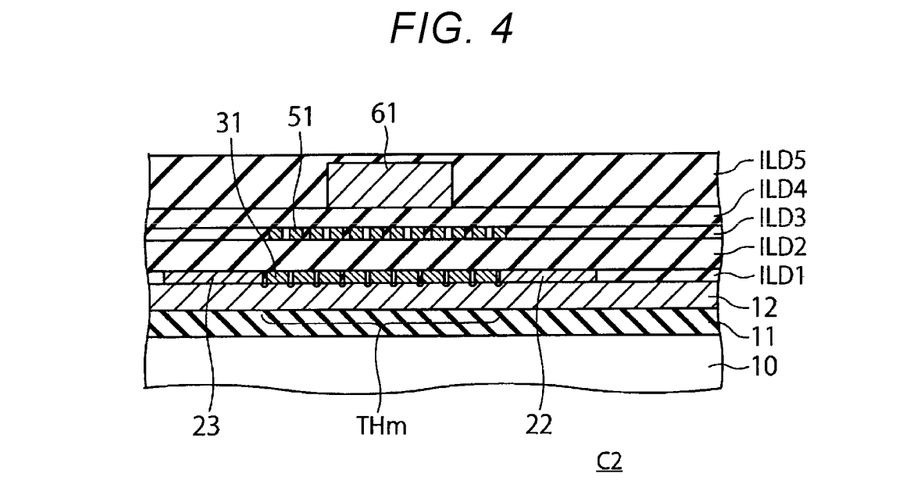
FIG. 4 is a cross-sectional view illustrating a configuration of another portion of an RF switch circuit according to the first embodiment.

FIG. 4 is a cross-sectional view illustrating a configuration of another portion of the RF switch circuit 5 according to the first embodiment. The RF switch circuit 5 includes interconnections 22 and 23, a plurality of FETs 31, a plurality of conductors 51, a signal interconnection 61, and the interlayer insulating films ILD1 to ILD5.

The FET 31 is, in general, similar in configuration to the FET 30. The plurality of FETs 31 are connected in series between the interconnections 22 and 23 and constitute one through-switch THm (where m is an integer (for example, m=7)).

The interconnections 22 and 23 are provided on the semiconductor layer 12 and electrically connect the through-switch THm to other elements (not shown). The through-switch THm and the interconnections 22 and 23 are covered (top and sides) with the interlayer insulating films ILD1 and ILD2. For example, a low resistance metal such as aluminum or copper is used for the interconnections 22 and 23 similarly to the interconnections 20 and 21.

The signal interconnection 61 is provided on the interlayer insulating film ILD4 and is provided above at least a part of the FETs 31 included in the through-switch THm. That is, the signal interconnection 61 overlaps the through-switch THm when being viewed from above along a direction orthogonal to a major surface of the semiconductor layer 12. For example, a low resistance metal such as aluminum or copper is used for the signal interconnection 61.

The plurality of conductors 51 are provided between the FETs 31 and the signal interconnection 61, and are arranged on a planar surface generally in parallel to the major surface of the semiconductor layer 12. For example, a low resistance metal such as aluminum or copper is used for the conductors 51 similarly to the signal interconnection 61, the bump 70, and the like. The conductors 51 are each in an electrically floating state and electrically insulated from other elements. Furthermore, the adjacent conductors 51 are electrically insulated from each other. A configuration of each of the conductors 51 will be described later in more detail.

The interlayer insulating films ILD1 to ILD5 cover the abovementioned constituent elements. For example, an insulating material such as polyimide is used for the interlayer insulating films ILD1 to ILD5.

As shown in the configuration depicted in FIG. 4, as compared to the configuration depicted in FIG. 3, the bump 70 and the contact plug 40 are not provided. Therefore, the through-switch THm passes or blocks (switches) radio frequency signals different from radio frequency signals passing through the signal interconnection 61. That is, the through-switch THm and the signal interconnection 61 generally pass or carrier signals having different frequencies and at different times. For example, a configuration of the dashed region C2 in FIG. 2 is similar to the configuration shown in FIG. 4.

The configuration of the conductors 50 will next be described.

Figure 5:
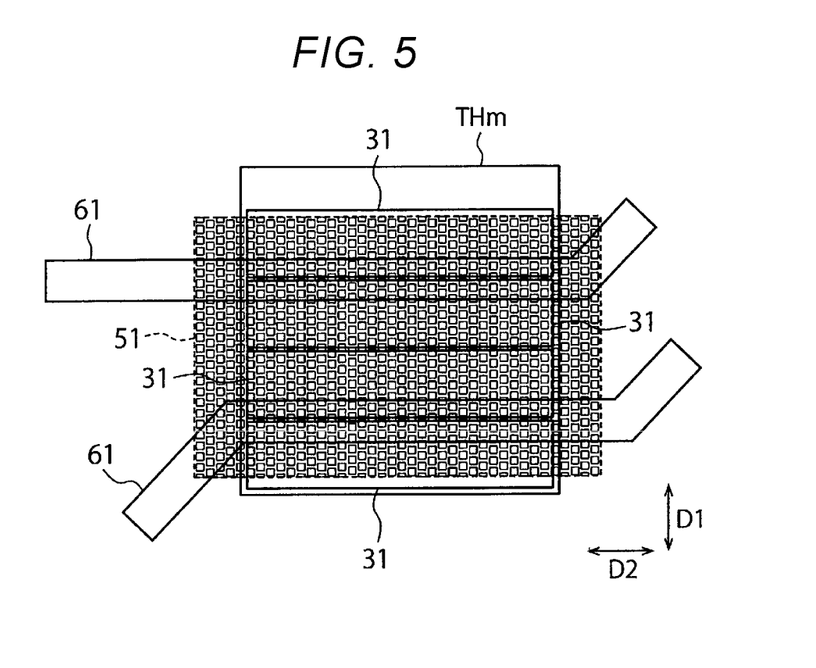
FIG. 5 is a layout diagram illustrating an example of an arrangement relationship among a through-switch, conductors, and a signal interconnection.

FIG. 5 is a layout diagram illustrating an example of an arrangement relationship among the through-switch THm, the conductors 51, and the signal interconnection 61. While FIG. 5 specifically illustrates the arrangement of the conductors 51 shown in FIG. 4, a similar arrangement is also provided for the conductors 50 shown in FIG. 3. In the latter case, it might be assumed that the signal interconnection 60 and the bump 70 as an alternative to the signal interconnections 61 are provided on the conductors 50 as an alternative to the conductors 51.

The through-switch THm includes a plurality of FETs 31 connected in series. While the through-switch THm includes four FETs 31 as depicted in FIG. 5, the through-switch THm may include three or less FETs 31 or five or more FETs 31 and is thus not limited to four.

The plurality of conductors 51 are arranged two-dimensionally in a matrix configuration within a dashed frame depicted in FIG. 5. In a planar layout viewed from above the major surface of the semiconductor layer 12, the conductors 51 are disposed to fill an overlapped region where the FETs 31 and the signal interconnection 61 overlap each other. Here, fill means the array formed by the plurality of conductors 51 is disposed so as to span the entirety of the region. That is, a region where the FETs 31 directly face the signal interconnection 61 without the conductors 51 being interposed is small while the FETs 31 face the signal interconnection 61 via the conductors 51 in most portions of the region where the FETs 31 face the signal interconnection 61. Needless to say, the conductors 51 may be disposed in regions other than the overlapped region where the FETs 31 and the signal interconnection 61 overlap each other. For example, the conductors 51 may be disposed above the entire planar area of the through-switch THm.

Figure 6:
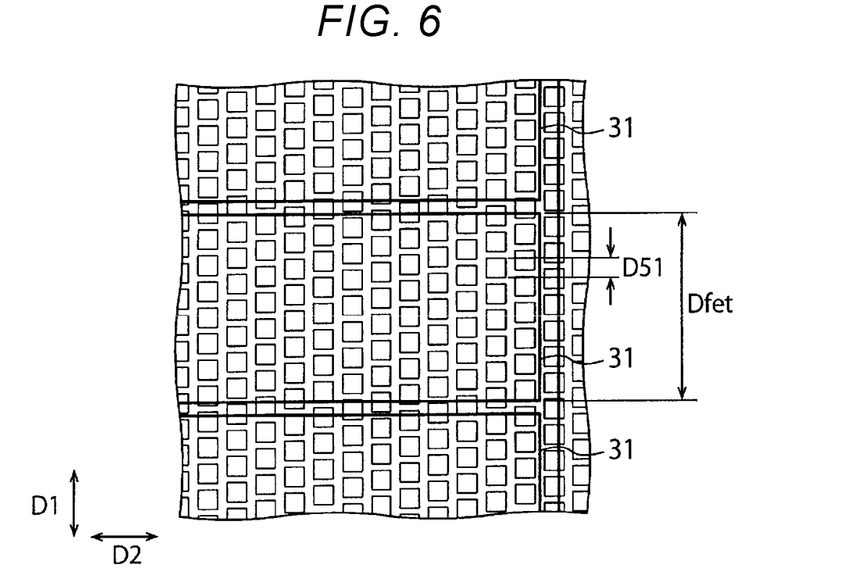
FIG. 6 is an enlarged view of a part of FIG. 5.

FIG. 6 is an enlarged view of a part of FIG. 5. It should be noted that the signal interconnection 61 is not specifically shown in FIG. 6 for clarity.

As shown in FIG. 6, each conductor 51 has a shape such as a generally quadrangular shape, a rectangular shape, or a polygonal shape in the plane generally in parallel to the major surface of the semiconductor layer 12. The plurality of conductors 51 are arranged generally linearly in a first direction D1, and arranged either in a curved configuration in a second direction D2 orthogonal to the first direction D1 or in an inclination direction with respect to the second direction D2. That is, the conductors 51 are offset from each other along the first direction D1 in adjacent columns that are spaced along the second direction D2. It is thereby possible to suppress a so-called waveguide effect that radio frequency signals passing between the adjacent conductors 51 in the second direction D2.

Figure 7:
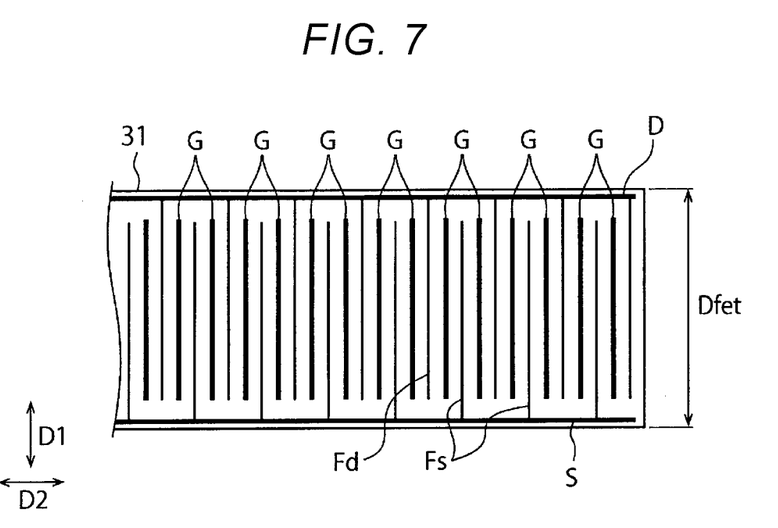
FIG. 7 is a plan layout diagram illustrating a portion of a particular field effect transistor (FET).

Furthermore, a length D51 of each conductor 51 is smaller than a width Dfet of each FET 31 in the first direction D1. The width Dfet will now be described. FIG. 7 is a plan layout diagram illustrating a portion of the FET 31. The FET 31 includes a source electrode S and a drain electrode D extending in the second direction D2. The FET 31 further includes a plurality of source layers (hereinafter, also "source fingers") Fs extending from the source electrode S in the first direction D1 and a plurality of drain layers (hereinafter, also "drain fingers") Fd extending from the drain electrode D in the first direction D1. The source fingers Fs and the drain fingers Fd extend from the source electrode S and the drain electrode D, respectively to sides opposite each other. That is, the source electrode S and the source fingers Fs are formed in a comb like configuration and the drain electrode D and the drain fingers Fd are also formed in a comb like configuration. Source-side tooth of a comb and drain-side tooth of a comb are disposed in a staggered configuration with each other. The FET 31 further includes gate electrode(s) G disposed between the source fingers Fs and the drain fingers Fd. The gate electrodes G are commonly controlled to cause the FET 31 to function as one switch. Therefore, a gate length (channel length) direction of the FET 31 is along the second direction D2. The width Dfet can be considered to be substantially equal to a spacing between the source electrode S and the drain electrode D. The width Dfet can also be considered to be approximately equal to a length of each source finger Fs in the first direction D1, a length of each drain finger Fd in the first direction D1, and a length of each gate electrode G in the first direction D1. The length D51 of each conductor 51 is smaller than the width Dfet of the FET 31. Therefore, it can be said that the length D51 is generally smaller than the length of each source finger Fs in the first direction D1, the length of each drain finger Fd in the first direction D1, or the length of each gate electrode G in the first direction D1. More preferably, the length D51 of each conductor 51 is less than or equal to one-fifth of a maximum width of the signal interconnection 61 along the first direction D1.

On the other hand, there is no specific lower limit to a dimension of each conductor 51 on the planar layout. Therefore, it suffices that the length D51 of each conductor 51 is smaller than the width Dfet of each FET 31. The above description applies not only to the configuration of each conductor 51 shown in FIG. 4 but also to the configuration of each conductor 50 shown in FIG. 3. Furthermore, the conductors 50 and 51 may be applied not only to the various through-switches but also to the shunt switches. It is noted that a planar shape of each of the conductors 50 and 51 may be a square shape, a rectangular shape, a polygonal shape or the like or may be a circular shape, an oval shape or the like. While the planar shape of each of the conductors 50 and 51 may be the same and may have the same area, the planar shapes do not necessarily have to be the same and the areas do not have to be the same for each conductor 50 or 51. Furthermore, while the conductors 50 and 51 are depicted as being arranged regularly in the planar layout, the conductors 50 and 51 may be arranged at random or irregularly.

The conductors 50 and 51 are, in general, formed as follows. First, the FETs 30 and 31 are formed on the semiconductor layer 12 and the interlayer insulating layers ILD1 and ILD2 are then formed. Next, a material layer (for example, aluminum or copper layer) for the conductors 50 and 51 is deposited. Next, the material layer for forming the conductors 50 and 51 is processed by means of a lithographic technique and an etching technique. The conductors 50 and 51 are thereby patterned into a desired planar layout. Next, the interlayer insulating film ILD3 is deposited on the conductors 50 and 51, thereby burying the conductors 50 and 51 in the interlayer insulating film ILD3. Subsequently, the interlayer insulating film ILD4, the contact plug 40, the interlayer insulating film ILD5, the interconnections 60 and 61, and the bump 70 are formed. As a result, the RF switch circuit 5 is completed.

As described so far, the RF switch circuit 5 according to the first embodiment includes the plurality of conductors 50 and 51 disposed between the FETs 30 and 31 of the through-switches THn and THm and the signal interconnections 60 and 61, respectively.

If no conductors 50 and 51 are provided, capacitive coupling between the FETs 30 and 31 and the signal interconnections 60 and 61 become locally strong. Owing to this, there is a risk of leakage of the radio frequency signals passing through the signal interconnections 60 and 61 to the FETs 30 and 31. There is also a risk of an increase in capacitances of the FETs 30 and 31 in off states. In this case, isolation characteristics, breakdown voltage characteristics or strain characteristics of the RF switch circuit 5 possibly degrade.

The RF switch circuit 5 according to the first embodiment, by contrast, is configured such that the FETs 30 and 31 are capacitively coupled with the signal interconnections 60 and 61 via the plurality of conductors 50 and 51, respectively. That is, the FETs 30 and 31 are capacitively coupled with the signal interconnections 60 and 61 not directly but indirectly via the conductors 50 and 51, which are respectively interposed therebetween. The capacitive coupling between the FETs 30 and 31 and the signal interconnections 60 and 61 is dispersed in a direction parallel to the major surface of the semiconductor layer 12 by the plurality of conductors 50 and 51 each having a size smaller than the width Dfet of each FET. For example, the influence of the radio frequency signals passing through the signal interconnections 60 and 61 is uniformly dispersed by the plurality of conductors 50 and 51. In this way, the conductors 50 and 51 can disperse (relax) the capacitive coupling between the FETs 30 and 31 and the signal interconnections 60 and 61 more uniformly in the direction of the major surface of the semiconductor layer 12, and can suppress the radio frequency signals from locally influencing a part of the FETs 30 and 31.

It is noted that each of the conductors 50 and 51 are in an electrically floating state. That is, adjacent conductors 50 (or 51) are not electrically connected to each other or any other conductive element in the device. The conductors 50 and 51 are dispersed (scattered) in the regions where the FETs 30 and 31 face the signal interconnections 60 and 61, respectively. It is thereby possible to improve the effect of dispersing/shielding the capacitive coupling between the FETs 30 and 31 and the signal interconnections 60 and 61 and suppress the capacitive coupling between the FETs and/or between the signal interconnections.

If, for example, the conductors 50 (or 51) are electrically connected to one another to form one conductive layer, then capacitive coupling will occur between adjacent FETs 30 (or 31) within the through-switch THn (or THm) via the conductive layer thus formed. In such a case, a breakdown voltage of the through-switch THn (or THm) would possibly fall.

The RF switch circuit 5 according to the first embodiment, by contrast, is configured such that the floating conductors 50 and 51 are dispersed in the regions where the FETs 30 and 31 face the signal interconnections 60 and 61, respectively. It is thereby possible to suppress the capacitive coupling between adjacent FETs and prevent a reduction in the breakdown voltage of the through-switch THn or THm including the FETs.

Figure 8:
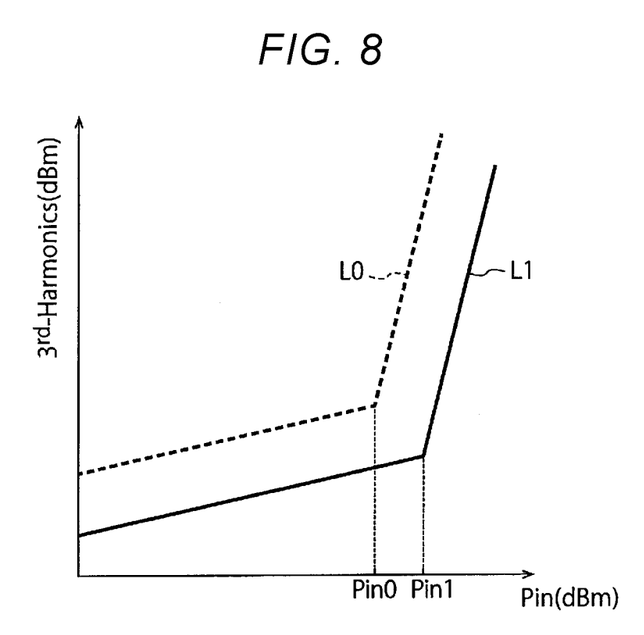
FIG. 8 is a graph illustrating characteristics of various RF switch circuits.

FIG. 8 is a graph illustrating characteristics of RF switch circuits. The vertical axis represents a magnitude (dBm) of third-order harmonics. The horizontal axis represents power (dBm) of an input signal. A line L0 indicates isolation characteristics and breakdown voltage characteristics of a conventional RF switch circuit (lacking the floating conductors 50 and 51, for example). A line L1 indicates isolation characteristics and breakdown voltage characteristics of the RF switch circuit 5 according to the first embodiment.

The comparison between the lines L0 and L1 shows that a ground parasitic capacitance that might have concentrated on a particular part of a plurality of stages of FETs 30 and 31 in a conventional RF switch circuit is averaged over the plurality of stages of FETs 30 and 31 by dispersing the capacitive coupling between the signal interconnections 60 and 61 and the FETs 30 and 31 in off states in the direction of the major surface of the semiconductor layer 12 in the RF switch circuit 5 according to the first embodiment. An imbalance of the ground parasitic capacitance in the plurality of stages of FETs 30 and 31 causes the generation of harmonics, so that averaging the ground parasitic capacitance can reduce third-order harmonics entering the through-switches THn and THm. As a result, the RF switch circuit 5 according to the first embodiment can improve strain characteristics. Furthermore, breakdown voltage characteristics Pin1 of the RF switch circuit 5 according to the first embodiment are higher than breakdown voltage characteristics Pin0 of the conventional RF switch circuit. That is, the RF switch circuit 5 according to the first embodiment can also improve the breakdown voltage characteristics.

As described so far, the RF switch circuit 5 can suppress degradation of the characteristics of the RF switch circuit 5 even if the signal interconnections 60 and 61 or the bumps 70 are disposed directly above the through-switches or the shunt switches. As a consequence, the RF switch circuit 5 according to the first embodiment can achieve excellent miniaturization while still suppressing the leakage and degradation of radio frequency signals.

(Second Embodiment)

Figure 9:
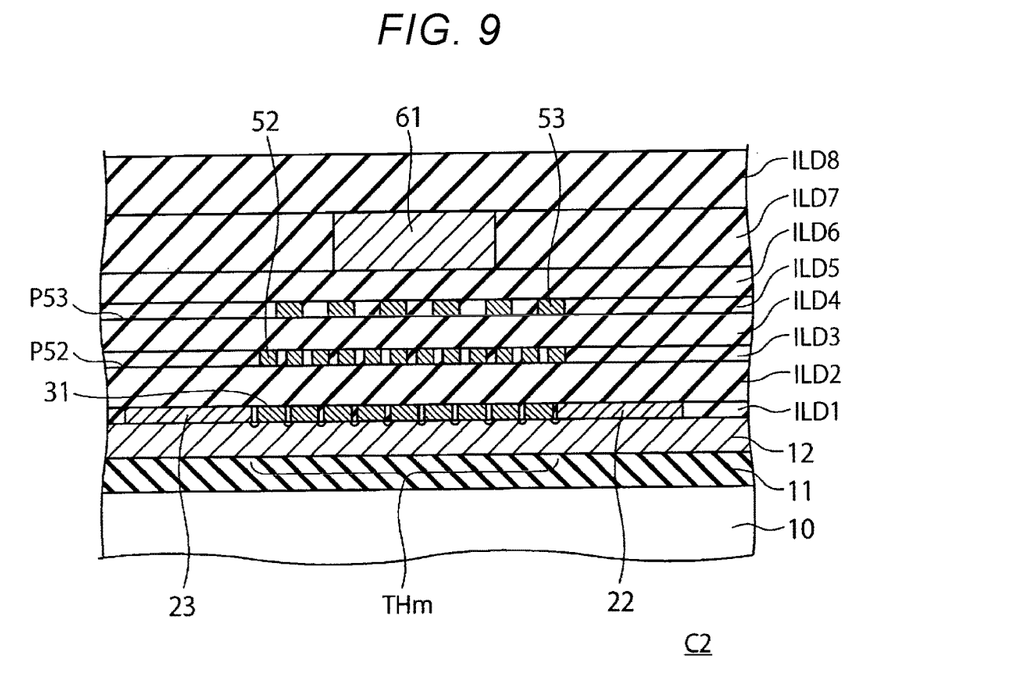
FIG. 9 is a cross-sectional view illustrating an example of a configuration of an RF switch circuit according to a second embodiment.

FIG. 9 is a cross-sectional view illustrating an example of a configuration of the RF switch circuit 5 according to a second embodiment. The second embodiment is applicable to both the configurations C1 and C2 shown in FIGS. 3 and 4. However, only the case of applying the second embodiment to the configuration (C2) shown in FIG. 4 will be described here as an example while the case of applying the second embodiment to the configuration C1 shown in FIG. 3 will not be specifically described, but should likewise be readily apparent from the present description which is also generally applicable to configuration C1.

The RF switch circuit 5 according to the second embodiment includes a plurality of first conductors 52 and a plurality of second conductors 53. That is, the RF switch circuit 5 includes the conductors 52 and 53 in separate layers. Other configurations of the second embodiment may be substantially the same as corresponding configurations of the first embodiment.

The plurality of first conductors 52 are provided between the FETs 31 and the signal interconnection 61, and arranged within a first plane surface P52 (first plane surface P52 may be referred to as a layer or a level) generally in parallel to the major surface of the semiconductor layer 12. For example, a low resistance metal such as aluminum or copper is used for the first conductors 52. The first conductors 52 are each in an electrically floating state and electrically insulated from other elements. Furthermore, the adjacent first conductors 52 are electrically insulated from each other.

The plurality of second conductors 53 are provided between the first conductors 52 and the signal interconnection 61, and arranged within a second plane surface P53 (second plane surface P53 may be referred to as a layer or a level) generally in parallel to the major surface of the semiconductor layer 12. For example, a low resistance metal such as aluminum or copper is used for the second conductors 53 similarly to the first conductors 52. The second conductors 53 are each in an electrically floating state and thus electrically insulated from other elements. Furthermore, the adjacent second conductors 53 are electrically insulated from each other.

In this way, according to the second embodiment, the plurality of second conductors 53 is provided within a layer different from the layer within which the plurality of first conductors 52 is provided. That is, the capacitive coupling between the FETs 31 and the signal interconnection 61 may be dispersed in the direction parallel to the major surface of the semiconductor layer 12 by both the plurality of first conductors 52 and the plurality of second conductors 53. It is thereby possible to suppress the radio frequency signals passing through the signal interconnection 61 from locally influencing a part of the FETs 31.

It is noted that configuration and planar layout of the first and second conductors 52 and 53 may be substantially the same as those of the conductors 50 and 51 described in conjunction with the first embodiment. That is, a planar shape of each of the conductors 52 and 53 may be a square shape, a rectangular shape, a polygonal shape, a circular shape, an oval shape or the like. While the planar shape of each of the conductors 52 and 53 may be the same and each of the conductors 52 and 53 may have the same area, the planar shape and area is not required to be the same. Preferably, a maximum dimension (e.g., length in the first direction D1 and/or occupied planar area) of each first conductor 52 within the first planar surface P52 is smaller than a maximum dimension of each second conductor 53 within the second planar surface P53. This is because reducing the dimension of each first conductor 52, which being closer to the FETs 31, can achieve greater suppression of the capacitive coupling between the adjacent FETs 31 via the first conductors 52. Furthermore, while the conductors 52 and 53 are depicted as being arranged regularly, the conductors 52 and 53 may be arranged at random or irregularly within the respective planar surfaces (layers).

Figure 10:
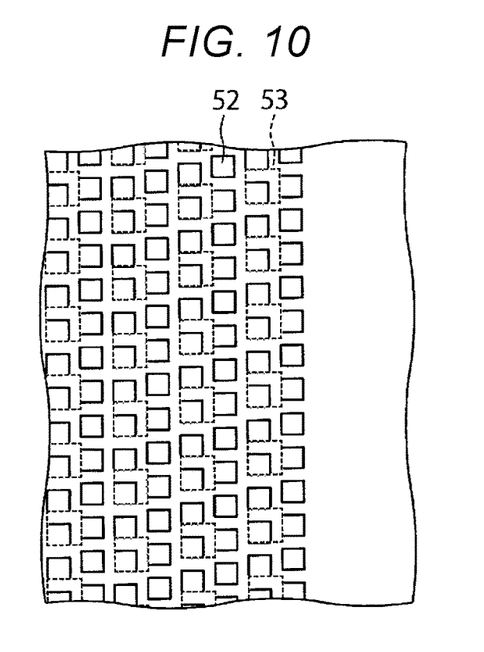
FIG. 10 is a plan view illustrating an example of an arrangement relationship of first and second conductors.

For example, FIG. 10 is a plan view illustrating an example of an arrangement relationship between the first conductors 52 and second conductors 53. The first conductors 52 are arranged generally linearly in columns along the first direction D1 (up-down page direction in FIG. 10) and offset or staggered from each other in adjacent columns spaced along the second direction D2 (left-right page direction in FIG. 10) within the first planar surface P52. Similarly, the second conductors 53 are arranged generally linearly in columns along the first direction D1 and offset or staggered with each other in adjacent columns spaced from each other along the second direction D2 within the second plane surface P53.

In this case, the planar area of each first conductor 52 within the first planar surface P52 is smaller than that of each second conductor 53 within the second plane surface P53. It is thereby possible to suppress the capacitive coupling between the adjacent FETs 31.

Moreover, a spacing between the first conductors 52 within the first planar surface P52 is less than a spacing between the second conductors 53 within the second planar surface P53. In FIG. 10, for example, a pitch of the first conductors 52 is shorter than a pitch of the second conductors 53. In this way, disposing the relatively small first conductors 52 at the shorter pitch can contribute to further improving the dispersion of the capacitive coupling between the FETs 31 and the signal interconnection 61.

According to the second embodiment, the RF switch circuit 5 includes two conductor layers (shield layers) including the first and second conductors 52 and 53, respectively. However, the number of conductor layers is not limited and may also be three or more. It is thereby possible to further improve the dispersion of the capacitive coupling between the FETs 31 and the signal interconnection 61 by inclusion of additional conductor layers.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a field effect transistor formed on a semiconductor layer;
   a signal interconnection wiring above the field effect transistor in a first direction that is orthogonal to a plane of the semiconductor layer; and
   a plurality of floating conductors between the field effect transistor and the signal interconnection wiring in the first direction, wherein:
   a length, in a second direction, of each floating conductor in the plurality of floating conductors is less than a width, in the second direction, of a gate of the field effect transistor, and
   the second direction is parallel to the plane of the semiconductor layer and perpendicular to a gate length direction of the field effect transistor.

2. The semiconductor device according to claim 1, further comprising a terminal above the signal interconnection wiring in the first direction, wherein the signal interconnection wiring is between the terminal and the plurality of floating conductors in the first direction.

3. The semiconductor device according to claim 2, further comprising:
   a first interconnection wiring connected to an end of the field effect transistor and extending in a same layer as the field effect transistor along the gate length direction; and
   a second interconnection wiring connected to the first interconnection wiring, extending in the first direction, and contacting the signal interconnection wiring.

4. The semiconductor device according to claim 1, further comprising an interlayer dielectric material surrounding each floating conductor in the plurality of floating conductors.

5. The semiconductor device according to claim 4, wherein the interlayer dielectric material is polyimide.

6. The semiconductor device according to claim 1, wherein the plurality of floating conductors fills a region where at least a portion of the field effect transistor and a portion the signal interconnection wiring overlap each other when viewed along the first direction.

7. The semiconductor device according to claim 1, wherein the plurality of floating conductors is disposed in a regular array of rows and columns within a plane that is parallel to the plane of the semiconductor layer.

8. The semiconductor device according to claim 1, wherein the plurality of floating conductors comprises:
   a plurality of first conductors disposed on a first planar level that is between the field effect transistor and the signal interconnection wiring, and
   a plurality of second conductors disposed on a second planar level parallel to first planar level and above the first planar level in the first direction.

9. The semiconductor device according to claim 8, wherein a spacing between the plurality of first conductors along the second direction is narrower than a spacing between the plurality of second conductors along the second direction.

10. The semiconductor device according to claim 9, wherein a planar area, within the first planar level, of each first conductor of the plurality of first conductors is less than a planar area, within the second planar level, of each second conductor of the plurality of second conductors.

11. The semiconductor device according to claim 8, wherein a planar area, within the first planar level, of each first conductor of the plurality of first conductors is less than a planar area, within the second planar level, of each second conductor of the plurality of second conductors.

12. The semiconductor device according to claim 1, further comprising:
   a terminal above the signal interconnection wiring in the first direction, wherein
   the terminal comprises a low resistance metal bump.

13. The semiconductor device according to claim 1, wherein each floating conductor in the plurality of floating conductors is electrically separated from every other floating conductor in the plurality of floating conductors.

14. A semiconductor device, comprising:
a semiconductor layer on an insulating layer;
a field effect transistor formed on the semiconductor layer for passing or blocking a radio frequency signal between a first signal port and a second signal port;
a signal interconnection wiring above the field effect transistor in a first direction that is orthogonal to a plane of the semiconductor layer;
an insulating material between the field effect transistor and the signal interconnection wiring in the first direction;
a plurality of conductive bodies dispersed in the insulating material between the field effect transistor and the signal interconnection wiring in the first direction, wherein:
a length, in a second direction, of each conductive body in the plurality of conductive bodies is less than a width, in the second direction, of a gate of the field effect transistor, and
the second direction is parallel to the plane of the semiconductor layer and perpendicular to a gate length direction of the field effect transistor.

15. The semiconductor device according to claim 14, wherein the plurality of conductive bodies comprises:
a plurality of first conductors disposed in a first planar array on a first planar level between the field effect transistor and the signal interconnection wiring, and
a plurality of second conductors disposed in a second planar array on a second planar level that is parallel to first planar level and above the first planar level in the first direction.

16. An RF switching device, comprising:
a semiconductor layer on a substrate;
a switch on the semiconductor layer, the switch being between a first terminal and a second terminal and comprising a field effect transistor to electrically connect or disconnect the first terminal and the second terminal;
a signal interconnection wiring above the switch in a first direction that is orthogonal to a plane of the semiconductor layer;
an interlayer insulating material between the switch and the signal interconnection wiring in the first direction; and
a plurality of floating conductors in the interlaying insulating material between the switch and the signal interconnection wiring in the first direction, wherein
a length, in a second direction, of each floating conductor in the plurality of floating conductors is less than a width, in the second direction, of a gate of the field effect transistor, and
the second direction is parallel to the plane of the semiconductor layer and perpendicular to a gate length direction of the field effect transistor.

17. The RF switching device according to claim 16, wherein the switch is a through-switch or a shunt-switch.

18. The RF switching device according to claim 16, wherein each floating conductor in the plurality of floating conductors is electrically separated from every other floating conductor in the plurality of floating conductors.

19. The RF switching device according to claim 16, further comprising a terminal above the signal interconnection wiring in the first direction, wherein the signal interconnection wiring is between the terminal and the plurality of floating conductors in the first direction.

20. The RF switching device according to claim 16, wherein the plurality of floating conductors comprises:
a plurality of first conductors disposed on a first planar level between the switch and the signal interconnection wiring, and
a plurality of second conductors disposed on a second planar level that is parallel to first planar level and above the first planar level in the first direction.

* * * * *